(12) United States Patent
Christensen et al.

(10) Patent No.: US 10,386,422 B2
(45) Date of Patent: Aug. 20, 2019

(54) ELECTROCHEMICAL IMPEDANCE SPECTROSCOPY IN BATTERY MANAGEMENT SYSTEMS

(71) Applicant: LITHIUM BALANCE A/S, Ishoj (DK)

(72) Inventors: Andreas Elkjaer Christensen, Ishoj (DK); Rasmus Rode Mosbaek, Ishoj (DK)

(73) Assignee: LITHIUM BALANCE A/S, Ishoj (DK)

( * ) Notice: Subject to any disclaimer, the term of this patent is extended or adjusted under 35 U.S.C. 154(b) by 0 days.

(21) Appl. No.: 15/328,866

(22) PCT Filed: Jul. 17, 2015

(86) PCT No.: PCT/IB2015/055441
§ 371 (c)(1),
(2) Date: Jan. 24, 2017

(87) PCT Pub. No.: WO2016/012922
PCT Pub. Date: Jan. 28, 2016

(65) Prior Publication Data
US 2017/0219660 A1    Aug. 3, 2017

(30) Foreign Application Priority Data

Jul. 25, 2014  (DK) .............................. 2014 00418

(51) Int. Cl.
*G01R 31/392*   (2019.01)
*G01R 31/389*   (2019.01)
(Continued)

(52) U.S. Cl.
CPC ............ *G01R 31/392* (2019.01); *B60L 50/64* (2019.02); *B60L 58/12* (2019.02); *B60L 58/14* (2019.02);
(Continued)

(58) Field of Classification Search
None
See application file for complete search history.

(56) References Cited

U.S. PATENT DOCUMENTS 6,876,174 B1    4/2005  Marti et al.
2003/0184307 A1* 10/2003 Kozlowski ............ B60L 3/0046
                                                      324/427
(Continued)

FOREIGN PATENT DOCUMENTS

CN      102809691      12/2012
FR       2923023       5/2009

OTHER PUBLICATIONS

International Search Report on corresponding PCT application (PCT/IB2015/055441) from International Searching Authority (EPO) dated Dec. 1, 2015.
(Continued)

*Primary Examiner* — Melissa J Koval
*Assistant Examiner* — Nasima Monsur
(74) *Attorney, Agent, or Firm* — Klein, O'Neill & Singh, LLP (57) ABSTRACT

The invention pertains to a method of determining the State of Health (SoH) and/or State of Charge (SoC) of a rechargeable battery during use of said battery, the method comprising the steps of: generating a first excitation signal within a first selected frequency range, generating a second excitation signal within a second selected frequency range, applying said first and second excitation signals on said rechargeable battery, measuring the response signal for each of said two excitation signals, and then calculate the Electrochemical Impedance (EI) as the ratio between the excitation signals and respective response signals, and then determine the SoH and/or SoC of the rechargeable battery by comparing the calculated EI to a circuit model for the battery and/or determining the SoH and/or SoC of the rechargeable battery
(Continued)

by directly evaluating characteristics of the El. The invention also pertains to a battery management system configured for executing the steps of the method according to the invention.

16 Claims, 7 Drawing Sheets

(51) Int. Cl.
    *H02J 7/00*     (2006.01)
    *B60L 58/16*     (2019.01)
    *B60L 58/14*     (2019.01)
    *B60L 58/12*     (2019.01)
    *B60L 58/22*     (2019.01)
    *B60L 50/64*     (2019.01)

(52) U.S. Cl.
    CPC ............... *B60L 58/16* (2019.02); *B60L 58/22* (2019.02); *G01R 31/389* (2019.01); *H02J 7/0047* (2013.01)

(56) References Cited

U.S. PATENT DOCUMENTS

| | | |
|---|---|---|
| 2003/0204328 A1 | 10/2003 | Tinnemeyer |
| 2007/0257681 A1* | 11/2007 | Christophersen .. G01R 31/3651 324/426 |
| 2011/0208451 A1 | 8/2011 | Champlin |
| 2012/0019253 A1 | 1/2012 | Ziegler et al. |
| 2012/0078552 A1* | 3/2012 | Mingant ............ G01R 31/3651 702/63 |
| 2012/0316814 A1* | 12/2012 | Rahaman ........... G01R 31/3679 702/63 |
| 2013/0069660 A1* | 3/2013 | Bernard ............. G01R 31/3651 324/430 |
| 2014/0312915 A1 | 10/2014 | Mukaitani et al. |

OTHER PUBLICATIONS

Written Opinion on corresponding PCT application (PCT/IB2015/055441) from International Searching Authority (EPO) dated Dec. 1, 2015.

* cited by examiner

ELECTROCHEMICAL IMPEDANCE SPECTROSCOPY IN BATTERY MANAGEMENT SYSTEMS

CROSS-REFERENCE TO RELATED APPLICATIONS

This application is the national phase entry, under 35 U.S.C. Section 371(c), of International Application No. PCT/IB2015/055441, filed Jul. 17, 2015, claiming priority from Danish Application No. PA 2014 00418, filed Jul. 25, 2014. The disclosures of the International Application and the Danish Application from which this application claims priority are incorporated herein by reference in their entireties.

FEDERALLY SPONSORED RESEARCH OR DEVELOPMENT

Not Applicable

BACKGROUND

Technical Field

The present invention pertains to the use of electrochemical impedance spectroscopy measurements in battery managements systems in order to determine state of health (SoH) of a rechargeable battery during use, and to balancing of battery cells during use of said battery, i.e. during charging and discharging.

Background of the Invention

With the increasing use of lithium-ion batteries in our everyday lives, especially in electrical vehicles, the need for longer battery life becomes increasingly important. Battery life in this context refers to battery endurance, how long a pack or cell can continue operation before it requires recharging.

While there is a difference in how the extended battery life is accomplished (more efficient components or larger capacity batteries), there is also an increased expectation of the accuracy of the state of charge (SoC) prediction for these applications. Additionally, there is a desire for increased longevity and even second life applications in the case of larger battery systems, such as those found in electric vehicles.

When manufacturing batteries it is known to derive models for said batteries by Electrochemical Impedance Spectroscopy (EIS) measurements before the battery is put in use. However, in the context of an electric vehicle, where the batteries should last many years, the models derived from EIS measurements would become inaccurate over time.

The battery parameters adapted to an aged battery cell in a battery management system (BMS) during operation will never be as good as the parameters measured for a new cell in a laboratory. There is therefore a need for a battery management system, which may be able to handle the decreased accuracy of the battery state (the battery model).

SUMMARY OF THE INVENTION

It is thus an object of the present invention to provide a method of more accurately determining various parameters, such as state of charge and/or state of health, of a battery during actual use instead of relying on a predictive or factory model for the battery.

It is a further object of the invention to determine various parameters, such as state of charge and/or state of health, of a battery during actual use and to use said parameters for cell balancing.

It is a further object of the invention to provide a more effective modular battery management system.

According to the present invention, the above-mentioned and other objects are fulfilled by a method of determining the State of Health (SoH) and/or State of Charge (SoC) of a rechargeable battery during use of said battery, the method comprising the steps of:
  generating a first excitation signal within a first selected frequency range,
  generating a second excitation signal within a second selected frequency range,
  applying said first and second excitation signals on said rechargeable battery,
  measuring the response signal for each of said two excitation signals, and then
  calculate the Electrochemical Impedance (EI) as the ratio between the excitation signals and respective response signals, and then
  determine the SoH and/or SoC of the rechargeable battery by comparing the calculated EI to a circuit model for the battery and/or determining the SoH and/or SoC of the rechargeable battery by directly evaluating characteristics of the EI.

Determining the EIS measurement data during operation of the battery gives an increased battery state accuracy for any battery that has been cycled even a few times. Preferably, the EIS if determined during charging and/or discharging.

By using two excitation signals—one for each selected frequency region—it is possible to reduce the computational complexity of the problem of calculating the electrochemical impedance spectrum, that it is feasible to be implemented in a microcontroller of a standard battery management system, which is used in electrical vehicles today.

In an embodiment these characteristics, which are determined directly from the EI may be places wherein Imag (Z)=0, or wherein the slope of the impedance curve in real vs. Imaginary plot is zero.

An embodiment of the method according to the invention, further comprises the steps of:
  calculating the real and imaginary parts of the EI and possibly representing the EI in a Nyquist plot, and then
  determine the SoH and/or SoC of the rechargeable battery by curve fitting of a circuit model for the battery to the calculated real and imaginary parts of the EI or the Nyquist plot.

The characteristic attributes from the Nyquist plot would predict the battery ageing due to both cycling and calendar life and also to encompass the power fade based on the increased internal impedance in the battery.

Not only does the on-board EIS improve the accuracy of incorporated SoH models over the life of the entire battery system, it also opens up opportunities for the BMS to react to unforeseen changes in the battery kinetics that were not predicted by the initial cycling of the battery before installing it into a given system, such as a vehicle.

A further embodiment of the method according to the invention, further comprises the steps of:
  calculating the magnitude of the EI as a function of frequency, and then determine the SoH and/or SoC of the rechargeable battery by fitting the magnitude curve (Bode plot) of the EI as a function of frequency to a circuit model of the battery.

Hereby frequency dependent parameters pertaining to the magnitude spectrum of the complex impedance of the battery are readily predictable.

A further embodiment of the method according to the invention, further comprises the steps of calculating the phase of the EI as a function of frequency, and then determine the SoH and/or SoC of the rechargeable battery by fitting the phase curve of the EI as a function of frequency to a circuit model of the battery (Bode plot).

Hereby frequency dependent parameters pertaining to the phase spectrum of the complex impedance of the battery are readily predictable.

In a further embodiment of the method according to the invention, the first selected frequency range comprises frequencies lower than the frequencies comprised in the second selected frequency range.

In a further embodiment of the method according to the invention, the first selected frequency range comprises frequencies lower than the frequencies comprised in the second selected frequency range, and wherein said two frequency ranges are overlapping.

In a further embodiment of the method according to the invention, the first selected frequency range comprises frequencies lower than the frequencies comprised in the second selected frequency range, and wherein said two frequency ranges are nonoverlapping.

In a further embodiment of the method according to the invention, the first selected frequency range comprises frequencies in the range 0.1 Hz to 1 Hz, preferably 0.1 to 1000 Hz, and wherein the second selected frequency range comprises frequencies in the range 1000 Hz to 5000 Hz, or 500 Hz to 5000 Hz, or 1000 HZ to 10000 Hz.

In a further embodiment of the method according to the invention, the first excitation signal is a current signal and the response is a voltage signal.

In a further embodiment of the method according to the invention, the second excitation signal is a current signal and the response is a voltage signal.

In a further embodiment of the method according to the invention, the second excitation signal is a voltage signal and the response is a current signal.

In a further embodiment of the method according to the invention, the first excitation signal is a voltage signal and the response is a current signal.

In theory both current and voltage signals can be interchanged for excitation, but practical limits in accuracy usually makes it much easier to control small currents than small voltages. This is particularly important when measuring the impedance of batteries, which are typically in the order of a few milli-Ohm. For appropriate impedance measurements, the excitation must not push the battery beyond a linear response region, which typically is within the order of plus/minus 10-20 mV, and since I=U/Z (where I is the current, U the voltage, and Z the impedance), the excitation current is in the range of a few Ampere—which can be controlled with greater accuracy than a few mV.

In a further embodiment of the method according to the invention, the first excitation signal is a continuously varying harmonic signal, such as a sinusoidal signal.

In a further embodiment of the method according to the invention, the first excitation signal is a stepped signal. In a further embodiment of the method according to the invention, the step signal is an alternating step signal or a ramped step signal.

In a further embodiment of the method according to the invention, the second excitation signal is a continuously varying harmonic signal, such as a sinusoidal signal.

In a further embodiment of the method according to the invention, the second excitation signal is a single frequency constant signal. Hereby the computational complexity is considerably reduced—especially if the second frequency region is in the intermediate or high frequency range, such as for example 1000 Hz to 5000 Hz.

In a further embodiment of the method according to the invention, the response signal is measured as a time domain signal and then Fourier transformed into the frequency domain in order to obtain the EI.

Electrochemical impedance spectroscopy (EIS) may be used to characterize different electrochemical system such as batteries. EIS uses the injection of an electrical signal and an analysis of the resulting response signal. The excitation can have many different waveforms, though investigations performed by the applicant have shown that a single sinusoidal signal may be used and it can either be a voltage or current signal.

Below are described three methods applicable to the implementation in a battery management system (BMS):

Single-sine impedance spectroscopy is performed by a creating an excitation signal using a dedicated frequency generator and amplifier and the alternating response signal consisting of another sinusoidal waveform is measured. In order to reduce the computational problem, single-sine impedance spectroscopy is used with a current excitation signal: $I(\omega)=I_0 \cdot e^{j(\omega t-\varphi)}$ and a voltage response signal $U(\omega)=U_0 \cdot e^{j\omega t}$, where $\omega$ is the angular frequency and $\varphi$ is a shift in the phase of the sinusoidal waveform. The impedance is then calculated as: $Z(\omega)=U(\omega)/I(\omega)=U_0/I_0 e^{j\varphi}$.

Alternatively, or in combination with the above, the Fourier transformed TDM technique may be used. TDM is a mathematical treatment, where time domain measurements are transformed into the frequency-domain. It is may be used on the relation between current and voltage changes in a battery to extract the electrochemical impedance spectroscopy data. The implementation to be considered here is the change in current (step) from one constant level to another while rapidly measuring the resulting voltage variation, either through detection of step via measurement or as a controlled technique induced by the BMS. This variation in voltage and current is then mathematically transformed from the time-domain into the frequency domain using Fourier transforms, thus presenting the impedance.

Yet, another technique is the determination of a fixed frequency alternating current impedance data point, which is obtained by applying a fixed frequency excitation and measuring the alternating voltage to get the impedance at a single point. It is a subset of single-sine method, and thus requires less computational resources and hardware to perform.

In a further embodiment of the method according to the invention, the circuit model is a Randles circuit or a circuit equivalent to a Randles circuit.

In a further embodiment of the method according to the invention, the first and/or second excitation signals are generated by a dedicated frequency generator.

In a further embodiment of the method according to the invention, the EI is determined for each cell or each block of cells in the rechargeable battery, and wherein the cells or blocks of cells are balanced in dependence of the obtained EI for each cell or block of cells.

In a further embodiment of the method according to the invention, the cells or block of cells are balanced by moving energy from cells or blocks of cells having relatively lower EI to cells or blocks of cells having relatively higher EI.

The method may according to a further embodiment, further comprise the step of determining the capacity of each cell or each block of cells in the rechargeable battery and balance said cells or blocks of cells by moving energy from cells or blocks of cells having relatively lower capacity and relatively lower EI to cells or blocks of cells having relatively higher capacity and relatively higher EI.

The ability to have up-to-date information on the internal impedance development (e.g. from a BMS) also allows for smarter balancing of individual batteries, as the BMS will be better to predict which individual battery inside the battery pack will be limiting for either discharge or charge currents. One way to do this is by looking at the individual capacities of each battery and fill from a higher capacity battery to a lower capacity battery. Hence, if one of the batteries with higher capacity also has higher impedance, taking energy from that battery will not be beneficial. The reverse would actually work better as the battery with higher impedance would discharge quicker than one with lower impedance.

Being aware of the individual impedances in each battery allows the BMS to shift energy from one battery to another based on the current conditions (rate of current, temperature, etc.) and thus extending each and every discharge cycle and shortening every charge cycle.

In a further embodiment of the method according to the invention, the SoH of the rechargeable battery comprises any of the following features in itself or in any combination: capacity fade, power fade, battery aging (e.g. due to irreversible lithium accumulation in the solid electrolyte interface), thermal runaways due to internal short circuits in the battery (e.g. due to dendrite growth that pierces the separator).

When discussing quantification of the available energy of a battery, the analogy is normally of a fuel gauge that displays the level of "fuel" left in the system. While this is easily accomplished with a determination of fuel volume in a traditional car for example, it is not as easy with the electrochemical energy stored in batteries.

There are three main methods to determine the electrochemical energy stored in a battery: The direct, the indirect and the adaptive. Direct methods include physical parameters such as the battery voltage or impedance measurements, indirect methods use coulomb counting with some form of calibration to reduce the accumulated errors, and adaptive methods can combine both direct and indirect methods and apply corrections. These methods all give the state of charge (SoC) for a battery, which is analogous to the volume of fuel, but since secondary batteries are used for hundreds to thousands of cycles, the fuel "health" must also be known. This is known as state of health (SoH) of a battery.

State of Health (SoH) is the generic term describing the performance of the battery relative to its new state, or its specifications. There is no agreed mathematical definition of SoH enshrined in an international standard, but there are some generally accepted definitions.

$$SoH_{capacity} = \frac{\text{current total capacity}}{\text{rated total capacity}}$$

Capacity fade—SoH in applications where the key limitation is the available energy such a electric vehicles that need range or energy storage solutions which require endurance, is measured as the percentage of the original or rated battery capacity available between the fully charged state and the fully discharged state.

$$SoH_{power} = \frac{\text{current available power}}{\text{initial available power}}$$

Power fade—SoH in hybrid vehicles and energy buffering systems (such as grid regulation) and the like focus on the battery's ability to deliver power. The thermal window of operation is fixed and the power capability within the thermal window of operation is determined by the increase in dissipated power due to the internal impedance of the battery. The SoH in such applications is defined as a function of the increase of battery impedance compared to the reference value.

Since $$P = U \cdot I$$

and $$U = R \cdot I$$

where R is the total battery resistance as a function of SoC and temperature, we get $$SoH_{power} = \frac{\frac{U_x^2}{R_x}}{\frac{U_0^2}{R_0}} = \frac{R_0 \cdot U_x^2}{R_x \cdot U_0^2}$$

where the index "0" is the initial and "x" the current value. If the measurements are then made at the same voltage as the initial level, the expression reduces to $$SoH_{power} = \frac{R_0}{R_x}$$

The power fade can thus be expressed as a function of the increase in total battery resistance. The above parameters may be used together to form the overall SoH.

Ageing can be divided into two principle types: Cycle related ageing (cycle life) and calendar related ageing (calendar life). During the first charge cycle of a lithium-ion battery, the electrolyte reacts with both the anode and the cathode to form a film called the solid electrolyte interface (SEI). This is a chemical reaction that continues throughout the life of the battery and is accelerated at elevated temperatures. The effect of the SEI on carbon anodes is well documented. The ever thickening film increases the internal resistance at all temperatures, but is worse at low temperatures where it becomes less porous to the passage of $Li^+$ ions which may lead to metallic lithium dendrites being deposited on the surface of the electrode. These dendrites lead to a loss of active material as well as pose a danger by creating internal short circuits or acting as a reaction amplifier during thermal runaway. SEI layers also forms on cathodes, but to a lesser extent and their impact on battery performance is not as marked.

The rocking chair mechanism that all lithium-ion battery chemistries utilize sees Li$^+$ ions migrating between intercalation sites in the positive and negative electrodes via the medium of the electrolyte. For charging, this typically means moving from the cathode (positive) electrode to the anode (negative).

Dependent on the nature of the electrode material, the intercalation sites may occupy a different volume when there is a Li$^+$ ion present, compared to when the intercalation sites are unoccupied. This expansion and contraction of the structure can lead to exfoliation whereby surface elements of the electrode material microstructure may crack and crumble reducing the active material of the electrode, creating a capacity reduction. This can be seen in many electrode materials including carbon and cobalt.

Hence, it is therefore possible to increase the cycle life of a battery by optimizing the depth of discharge window such that you keep the level of strain experienced by the electrodes/cycle within certain limits.

The separator in the lithium-ion batteries acts to keep the positive and negative electrodes separate to prevent internal shorting while still allowing the easy migration of Li$^+$ ions between the electrodes. The porous material of the separator becomes contaminated with element of the electrode materials as well as Li$^+$ ions being deposited as metallic lithium on the separator. This leads to reductions in active electrode material as well as reduction in the porosity of the separator leading to an increase in internal resistance.

A sudden increase or decrease in the battery impedance could be an early warning for a safety critical development inside the battery and detecting this would enable a BMS to properly eliminate any thermal run-away or otherwise dangerous situation.

The ageing of a battery is reflected in the EIS measurements and there is a correlation between both the double layer capacity and ohmic resistance to battery ageing. Pursuing these results, it would be possible to make a comparative analysis of the parameters using a BMS that makes an initial EIS measurement and subsequently analyses the progress, thus keeping track of the ageing.

The method may according to a further embodiment be applied to auxiliary components of a battery management system instead of merely to the rechargeable battery itself.

According to a preferred embodiment of the method according to the invention, the battery is a Lithium-ion battery comprising a plurality of battery cells. However, any other battery type may be used, such as lead-acid, Lithium-sulphur, Nartium-ion, Natruim-sulphur, Zinc-air, Lithium-air and other Lithium-metal batteries.

According to a preferred embodiment of the method according to the invention, the rechargeable battery comprises a plurality of cells, the response signal being measured over each of the cells and said excitation signals being applied over all of the plurality of cells of the rechargeable battery.

The excitation signal waveform is used in combination with the measured response signals to derive the impedance values of each cell. The setup is thereby simplified and the number of samples to be recorded are reduced.

The above mentioned and further objects are also fulfilled by a modular battery management system for controlling and monitoring a plurality of battery cells interconnected by a power bus, the battery management system comprising networked management units, said networked management units being operatively connected to an interface unit via a common system data-bus, each of which networked management units comprising an impedance sensor operatively connectable to a battery cell for determining the EI of it according to an embodiment of the method described above.

Preferably, the modular battery management system further comprises means for cell balancing. In a preferred embodiment of the modular battery management system, the battery cells are interconnected in series along said power bus.

An embodiment of the modular battery management system according to the invention, further comprises an auxiliary control unit also connected to the system data-bus, said auxiliary control unit comprising an impedance sensor for determining the EI of auxiliary components in accordance with an embodiment of a method as described above, wherein said excitation signals are applied to said components instead of the battery cells.

The method and modular battery management system according to an embodiment of the invention pertains particularly to larger applications that require microcontroller equipped battery management systems (BMS), such as light electric vehicles (LEV), plug-in hybrid electric vehicles (PHEV) and battery electric vehicles (BEV).

The battery chemistry is not limited to lithium-ion, it could easily be applied to other known, and future, battery chemistries as well. Throughout the present specification, the term battery applies to both a single cell and the combined battery pack.

To achieve the high voltages used in electric vehicles, batteries are connected in series in such a configuration any battery with lower energy content will fully discharge before the rest of the pack. This will limit the capacity of the whole pack to that of the battery with the lowest energy.

To avoid this weakest link situation, techniques are employed to try to equalize the level of charge or energy in each battery. This type of activity is known typically as balancing. In most cases, the balancing regime is based on the open circuit voltage, or measured terminal voltage at low (0.01 C) charge or discharge currents. This does not take into account the actual capacity of the battery with compensation for SoH.

Balancing can be broadly separated into passive and active. Passive balancing involves dissipating energy from batteries with higher energy content than the weakest battery and it is mainly used to compensate for differing self discharge rates and cycle efficiencies (energy in vs. energy out) between batteries. In practice, however, passive balancing only provides effective equalization of batteries on healthy packs if properly implemented.

Active balancing moves energy from one or more batteries or an external source to another battery in the pack. As energy is being transferred rather than dissipated, there are no challenges in removing excess heat from balancing shunt circuits allowing a larger amount of balancing energy to be used, reducing the balancing time. If integrated into the high voltage bus directly so that the available balancing energy is not limited by the capacity of the battery monitoring wires through which the balancing is typically done, then opportunities appear for high energy balancing which allows the system to compensate for defective batteries with significantly reduced capacity.

Typical active balancing solutions use balancing currents smaller than 2 A but there are some exceptions that are able to balance at 20 A in some specialist applications. Systems capable of these high balancing currents have been proven to improve pack capacity by up to 10% dependent on application and pack condition. In all cases, a key requirement for balancing is to determine where the energy needs to flow, which battery is the weakest link and what are the SoC and SoH of the individual batteries. Without this information, you are limited to low balancing currents at the extremes of the battery charge/discharge curves where the SoC corresponds more clearly to battery voltage.

BRIEF DESCRIPTION OF THE DRAWINGS

A further understanding of the nature and advantages of the present invention may be realized by reference to the remaining portions of the specification and the drawings. In the following, preferred embodiments of the invention are explained in more detail with reference to the drawings, wherein.

DETAILED DESCRIPTION

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout. Like elements will, thus, not be described in detail with respect to the description of each figure.

Electrochemical Impedance Spectroscopy (EIS) is a technique for characterizing any electro-chemical system. The technique uses the injection of an electrical signal and an analysis of the resultant response signal. The injected signal, or excitation, can have many types of waveform, but typically a single sinusoidal signal is used and it can either be a voltage or current signal.

Figure 1:
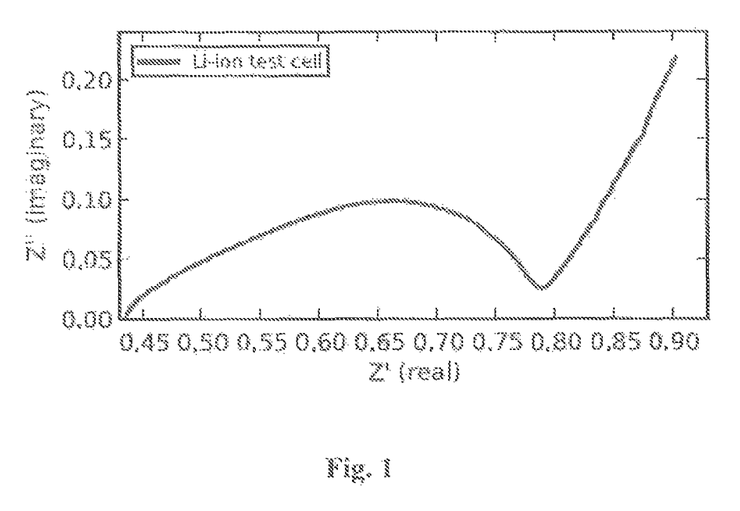
FIG. 1 shows a Nyquist plot showing impedance measurements on a Lithium-ion battery.

If the excitation is sufficiently small, the measured response can be used to calculate the resistance of the system. The small excitation is mainly necessary due to the linear approximation, but for certain systems such as batteries, the system may also change state if the excitation is not kept sufficiently small. As a rule-of-thumb, 10 mV is the excitation amplitude that is used. Due to the time dependent nature of the excitation there might be a phase change in the measured system and the complex resistance or impedance $Z(\omega)$ can be found from Ohms law when written using complex notation if the voltage and current is given by $$U(\omega) = U_0 \cdot e^{j\omega t}$$

and $$I(\omega) = I_0 \cdot e^{j(\omega t - \varphi)}$$

from which it follows that the impedance is $$Z(\omega) = \frac{U(\omega)}{I(\omega)} = \frac{U_0}{I_0} \cdot e^{j\phi}$$

and $$Z(\omega) = |Z| \cdot e^{j\phi} = R_{real} + j \cdot R_{img}$$

changing the excitation frequency of the sinusoidal input signal results in a changed angular frequency, $\omega$ as $\omega = 2\pi f$. The resulting impedance spectrum, for $Z(\omega)$ over the tested frequency range, can provide information on the condition of the electrodes and be used to quantify the kinetics of a battery. The general approach is to present the impedance spectrum in a Nyquist plot, plotting the real and imaginary components, $Z' = \text{Re}\{Z(\omega)\}$ and $Z'' = -\text{Im}\{Z(\omega)\}$ as illustrated in FIG. 1, which shows a Nyquist plot showing impedance measurement on a lithium-ion battery. High frequency measurements are closest to origo and frequencies decrease from left to right.

Figure 2:
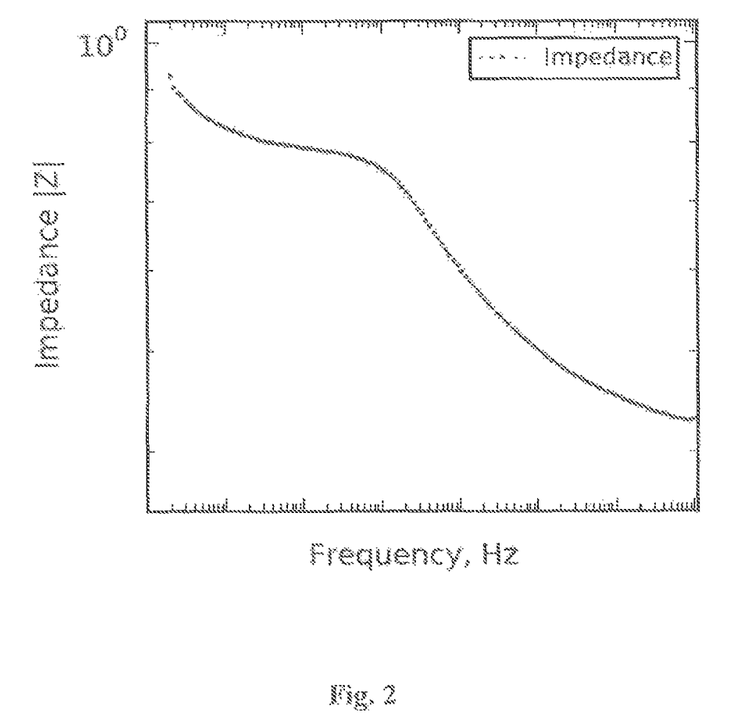
FIG. 2 shows a Bode plot of the magnitude spectrum of impedance measurements on a Lithium-ion battery as a function of frequency.
Figure 3:
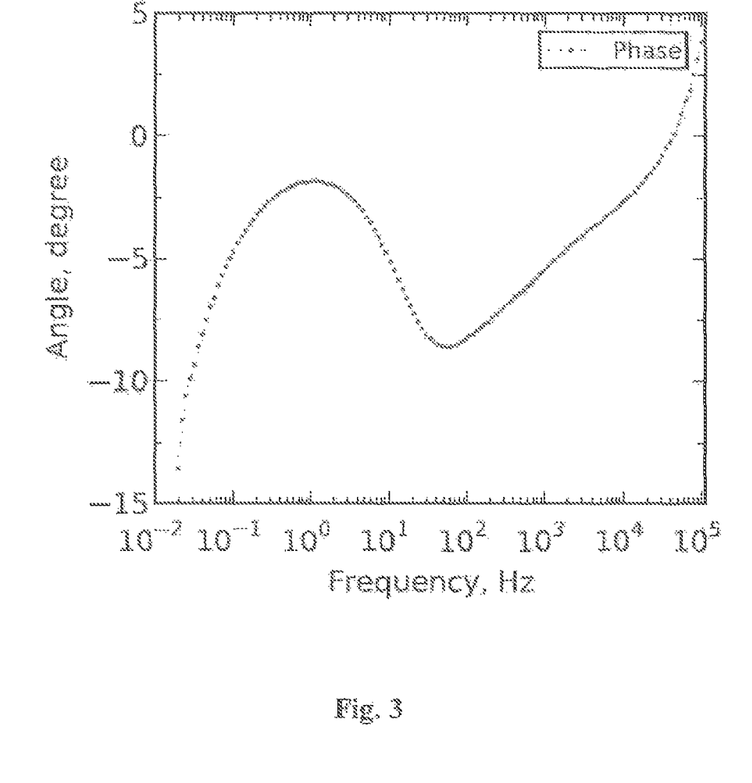
FIG. 3 shows a Bode plot of the phase of impedance measurements on a Lithium-ion battery as a function of frequency.

Since the Nyquist plot does not contain direct frequency data, it may be supplemented by a Bode plot that shows the magnitude of the impedance $$|Z| = \sqrt{R_{real}^2 + R_{img}^2}$$

and the phase $\phi$ as function of the frequency range. This is shown in FIGS. 2 and 3, respectively, that shows Bode plots showing impedance measurement on a lithium-ion battery.

Figure 4:
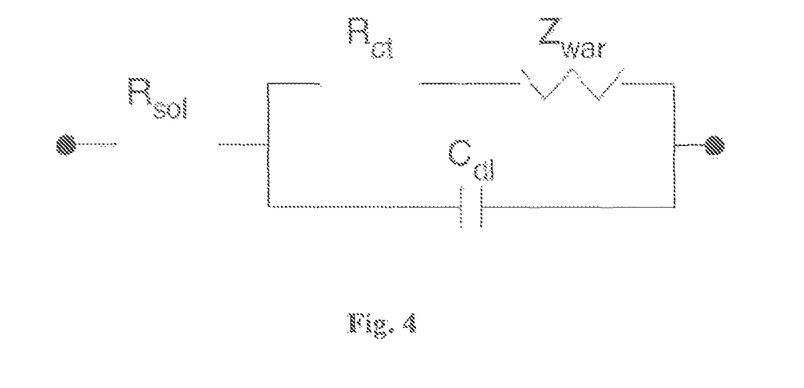
FIG. 4 shows a Randles equivalent circuit.

Using the EIS technique has the benefit of de-convoluting the time-domain and revealing simultaneous processes with different time-constants. The time-constants are parameterized using circuit theory and the semi-circles shown in the Nyquist plots can be modeled using a capacitor and a resistor in parallel. The "tail" in the low frequency impedance response may be modeled using the Warburg Impedance. Combining the elements gives a Randles equivalent circuit as shown in FIG. 4, which is used to model the impedance response from an "ideal" battery. $R_{sol}$ is the solution resistance, $R_{ct}$ the charge-transfer resistance, $C_{dl}$ the double layer capacitor, and $Z_{war}$ is the Warburg impedance.

Figure 5:
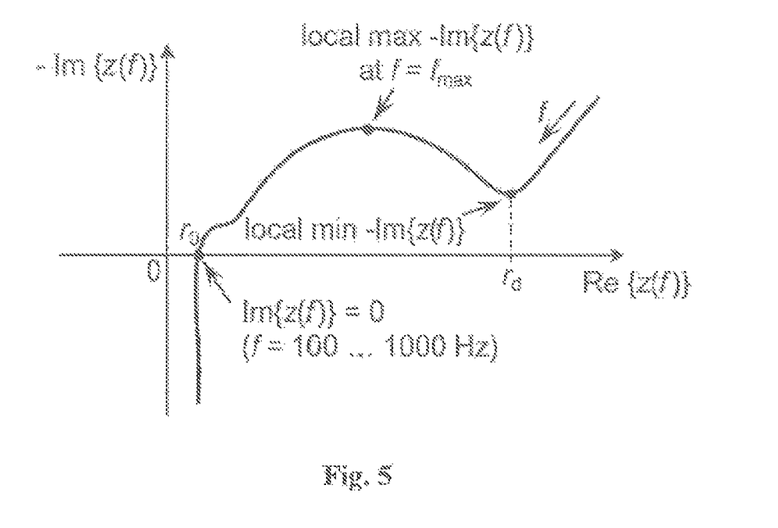
FIG. 5 shows characteristic attributes of a Nyquist plot.

It is possible to parameterize an equivalent circuit from the EIS measurements, such as the Randles circuit in FIG. 1, and incorporate the circuit into a model, and then use the model to predict SoC and SoH changes. Another approach is to look for attributes of the EIS spectrum itself that can be directly translated into indicators for SoC and SoH and then build a model of the dependency. The attributes that are used to describe the dynamic behavior of a lithium-ion battery can be seen in FIG. 5.

In context of an electric vehicle, where the batteries should last many years, the models derived from EIS measurements would become inaccurate over time. Some guess that their battery model would be accurate for 15-20 weeks and this implies that EIS tests can be done as part of routine vehicle maintenance (e.g. oil changes).

While this might work for hybrid vehicles that still have an internal combustion engine to service, the service intervals for electrical vehicles (EVs) are much longer. The longer service intervals for BEVs would require much more accurate models, because the battery parameters adapted to the aged cell in BMS during operation will never be as good as the parameters measured for a new cell in a laboratory. So being able to acquire the EIS measurement data during operation will lead to increased battery state accuracy for any battery that has been cycled even a few times.

Not only does the on-board EIS improve the accuracy of incorporated SoH models over the life of the entire battery system, it also opens up opportunities for the BMS to react to unforeseen changes in the battery kinetics that were not predicted by the initial cycling of the battery before installing it into the system.

A sudden increase or decrease in the battery impedance could be an early warning for a safety critical development inside the battery and detecting this would enable a BMS to properly eliminate any thermal run-away or otherwise dangerous situation.

The ageing of a battery is found to be reflected in the EIS measurements by both and there is a correlation between both the double layer capacity and ohmic resistance to battery ageing. Pursuing these results, it would be possible to make a comparative analysis of the parameters using a BMS that makes an initial EIS measurement and subsequently analyses the progress, thus keeping track of the ageing.

Figure 6:
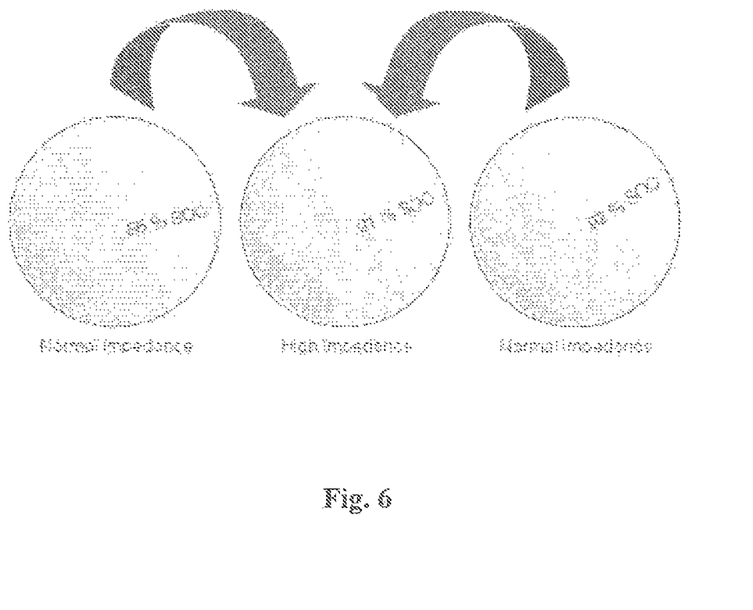
FIG. 6 shows a graphical representation of balancing optimization for discharge, based on impedance knowledge and capacity.

The ability to have up-to-date information on the internal impedance development from the BMS also allows for smarter balancing of individual batteries, as the BMS will be better to predict which individual battery inside the battery pack will be limiting for either discharge or charge currents. One way to do this is by looking at the individual capacities of each battery and fill from a higher capacity battery to a lower capacity battery. Hence, if one of the batteries with higher capacity also has a higher impedance, taking energy from that battery will not be beneficial. The reverse would actually work better as the battery with higher impedance would discharge quicker than one with lower impedance. This is pictured in FIG. 6, where energy is taken from a battery with lower capacity and lower impedance.

Being aware of the individual impedances in each battery allows the BMS to shift energy from one battery to another based on the current conditions (rate of current, temperature, etc.) and thus extending each and every discharge cycle and shortening every charge cycle.

Lithium-ion batteries represent a significant proportion of the cost of any device they are used in, this is especially true in the case of electro-mobility applications. With the common consensus of setting 80% SoH as the end of life in automotive applications, it could be said that over 80% of the original battery investment gets written off at the end of life.

The ability to use the battery in a second life application can dramatically change the economics of electro-mobility. Basic feasibility studies using OEM electric vehicle batteries for grid regulation have shown that the economics only stack up if the whole battery can be reused without the need to dismantle the pack and inspect/test the batteries individually. On-board EIS would be used to check the battery performance at end-of-life and provide the necessary information at battery level to enable second use at pack level with the benefit of the fusing and contactors already in the pack being utilized in the second life application to further reduce cost.

E.g. 100 batteries and a measurement range of 100 mHz to 100 kHz (with 10 measurements per decade=0.1-1 Hz=10, 1-10 Hz=10, 10-100 Hz=10, 100-1000 Hz=10, 1000-10000 Hz=10, 10000-100000 Hz=10), that is 6 decades and the measurement time is around 2 minutes per battery. With further optimizing the measurements, the time can be lowered to around half a minute per battery. Depending on system architecture, the overall measurement time is in the range of 30 seconds (100 measurement devices) to 50 minutes (1 measurement device).

When using on-board EIS, an important parameter of the EIS measurement is the sampling time. As the frequency sweep is performed on very low frequencies, the acquisition time can become very long. It is common to measure a frequency range over 6 decades with 10 measurements per decade. The overall measurement time for the entire sweep depends on a lot of factors but it is normally in the range of a minute or two. For on-board EIS to be useful, the measurement interval needs to be established. For SoH and balancing the interval of once per use (e.g. for every time the vehicle is switched off) is sufficient and keeping track of ageing once a week would also be sufficient.

The second life and safety intervals are two extremes and keeping in mind that EIS measurements so far have mainly been performed on systems in equilibrium (at open circuit voltage of the batteries), further research on how EIS measurements can be acquired from battery systems under load is needed.

On-board EIS measurements should be done at least after every use scenario to give sufficient information on SoH, balancing, ageing, and second life.

Hence, as a technique to analyze the state of a battery in a non destructive manner, electrochemical impedance spectroscopy offers many advantages. The information provided gives insights to the condition of the battery and the impedance analysis can reveal the degree of battery ageing as well as its state of health if the correct model is implemented.

Incorporating this technique into the battery management system such that it can be used in real time creates potential improvements in individual battery management with improved life and economics of the battery pack in its primary application and opens it up for easier reutilization in second life applications.

A battery management system with an on-board electrochemical impedance spectroscopy will be able to provide up-to-date predictions on state of health, ageing, and second-life usability. On top of that it will be able to improve balancing and potentially give early warnings for safety critical events such as thermal run-away.

Figure 7:
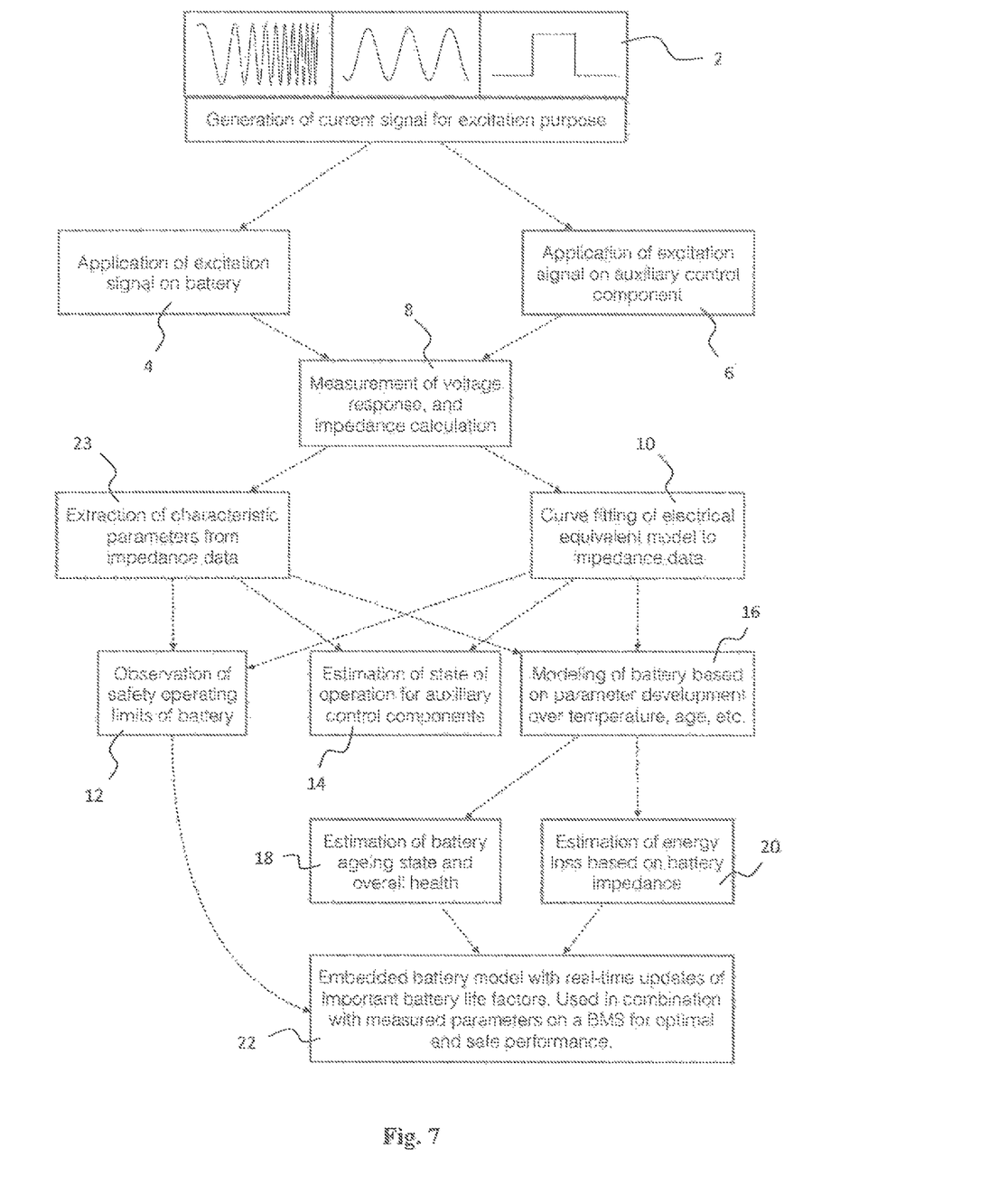
FIG. 7 shows a flow diagram of an embodiment of a method according to the invention, FIG. 8 schematically illustrates a system according to an embodiment of the invention, FIG. 9 schematically illustrates a system according to another embodiment of the invention, FIG. 10 schematically illustrates a battery management system according to an embodiment of the invention, FIG. 11 schematically illustrates a battery management system according to a further embodiment of the invention, and FIG. 12 schematically illustrates a battery management system according to a yet further embodiment of the invention.

FIG. 7 shows a flow diagram of an embodiment of the method according to the invention, the method comprising the steps of:

generating a first excitation current signal within a first selected frequency range, and at least a second excitation current signal within a second selected frequency range, as indicated by block 2. Applying said first and second excitation signals on said rechargeable battery, as indicated by step 4, and/or applying said first and second excitation signals on auxiliary control component, as indicated by step 6.

Then measuring the voltage response signal for each of said two excitation signals, as indicated by step 8, and then calculate the Electrochemical Impedance (EI) as the ratio between the excitation signals and respective response signals and perform curve fitting of an electrical equivalent model circuit to the impedance data, as indicated by step 10.

Based on this curve fitting in step 10, observations of safety operating limits of the battery are determined in step 12, and/or an estimation of state of operation of auxiliary components is determined in step 14, and/or modeling of the battery based parameter development over temperature or age is determined in step 16.

Based on this modeling in step 16, an estimation of battery aging state and overall health is determined in step 18, and/or an estimation of energy loss based on battery impedance is determined in step 20.

The attributes determined under step 18 and/or 20 are then used to real-time updating of the battery model, possibly in combination with measured parameters on a BMS for optimal and safe performance of the battery.

In FIG. 7 is also shown an optional step 23, which indicates a method step, wherein characteristic parameters are directly extracted from the impedance data, which then are used to determine the attributes under any of the steps 12, 14 and 16.

Certain embodiments pertain to a subset of the steps illustrated in FIG. 7. For example one method may comprise the steps 2, 4, 8, 10, any of: 12, 14 and 16, 18 and/or 20 and 22.

Another method may comprise the steps: 2, 4, 8, 23, any of: 12, 14 and 16, 18 and/or 20 and 22.

Another method may comprise the steps: 2, 4, 8, 23, 12, and 22.

Figure 8:
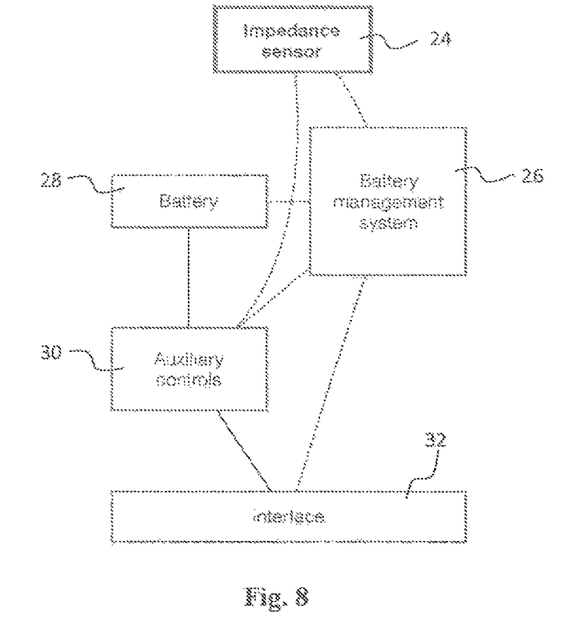
Figure 9:
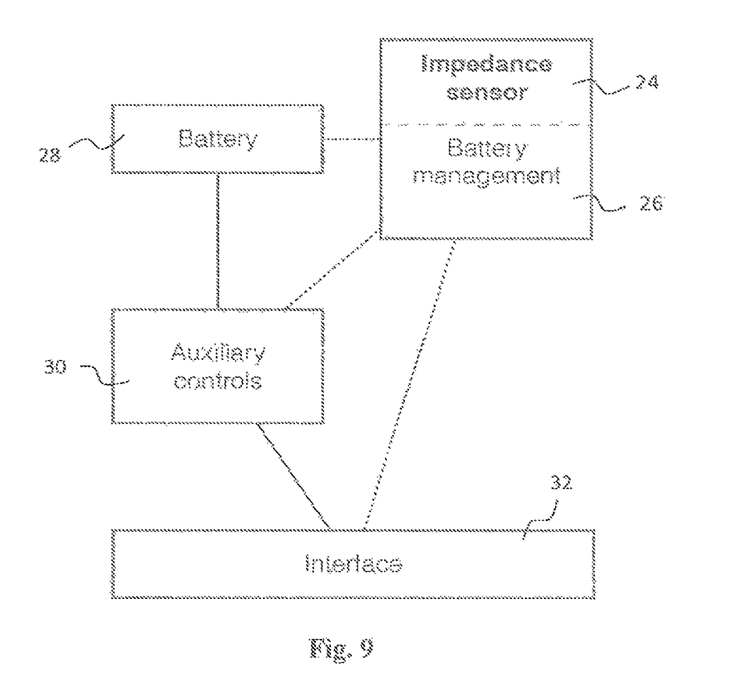

FIG. 8 and FIG. 9 show two embodiments of implementing an impedance sensor, either as a stand alone unit or as a unit, which is built into a battery management system.

The system schematically illustrated in FIG. 8 comprises an impedance sensor 24, operatively connected to a battery management system 26 and auxiliary controls 30. The battery management system 26 is furthermore operatively connected to a battery 28, auxiliary controls 30 and an interface unit 32. The battery 28 is electrically connected to the auxiliary controls 30, and the auxiliary controls 30 are electrically connected to the interface 32. The solid lines illustrate a power connection, and the dotted lines indicate communication busses.

Figure 10:
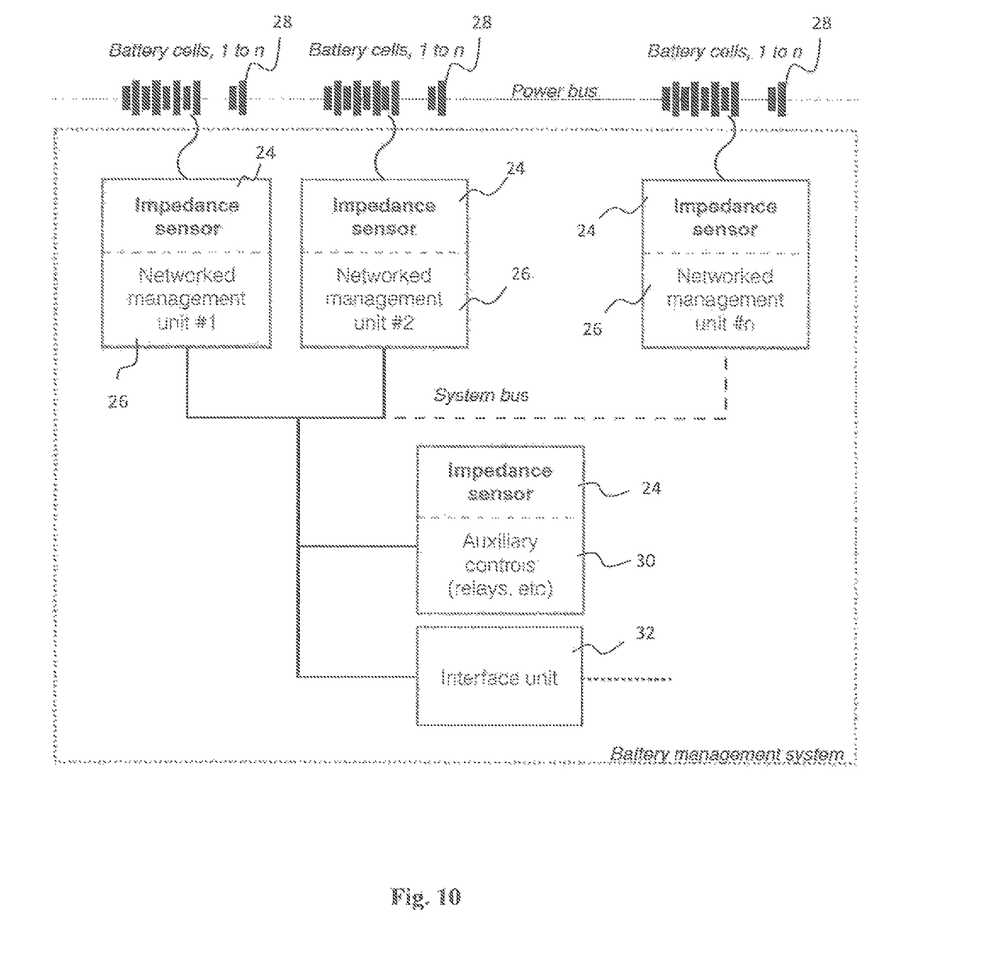

FIG. 10 shows a schematic diagram of an embodiment of a battery management system comprised of n networked management units (NMU) 26 connected to a system bus. Each NMU 26 is equipped with sensors for monitoring voltage, temperature, current, and impedance measurements 24 for each connected battery cell 28. The impedance sensors 24 on the NMU 26 are able to obtain the measurements by excitation of the battery cells 28, either when the NMU 26 detects an appropriate state of the battery cells 28, or when the state is dictated by the NMUs 26 (such as during charge mode). The battery management system is able to control auxiliary components 30 such as relays, recharge circuits, and other devices connected to the power bus. These auxiliary components 30 can be measured with an impedance sensor 24 when the system state allows for it. Appropriate measurements will indicate the wear of these components and also provide feedback on the ability to perform their task safely. An interface unit 32 provides relevant information to the 'outside' system which utilizes the battery power.

Figure 11:
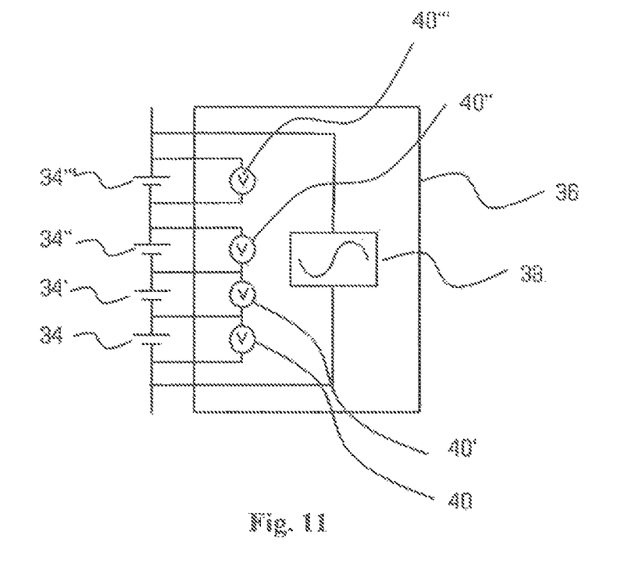

FIG. 11 shows a schematic diagram of a further embodiment of a battery management system, where the excitation signal is applied to each individual battery 34 34' 34" 34''' on a module level 36 so that a string of batteries 34 34' 34" 34''' is excited by an excitation signal 38 created on the module level hardware. This is performed on each module 36 by relevant excitation hardware. The excitation signal is connected to the cells 34 34' 34" 34''' by means of four-terminal sensing for the module configuration. The module uses two wires for providing the excitation signal 38. To get the response signal, the two existing battery voltage measurement wires 40 40' 40" 40''' are used.

If the excitation signal is measured, the battery voltages and currents must be measured simultaneously, and sampling requirements for the battery voltage and current measurements are e.g. a sampling rate of 0.01 ms (10 samples for a maximum of 10 kHz). All battery voltages 40 40' 40" 40''' are recorded simultaneously, either via 1 analog-to-digital converter (ADC) per battery channel, or with a sample-and-hold technique that stores the voltage. A multiplexer then switches between all the stored battery voltages and these are then converted by a single ADC.

Impedance measurements should be performed both during periods with zero current (OCV scenario) and during periods with constant current (DC offset scenario). The temperature should also be measured. This is accomplished either by temperature sensors on each battery or through a thermal model for the battery pack where the temperature may be derived from e.g. current and voltage.

The excitation signal may not be measured, but the knowledge of the excitation signal waveform may be used in combination with the measured response values. This simplifies the synchronization requirements and also minimizes the sampling requirements for the battery current measurement.

Figure 12:
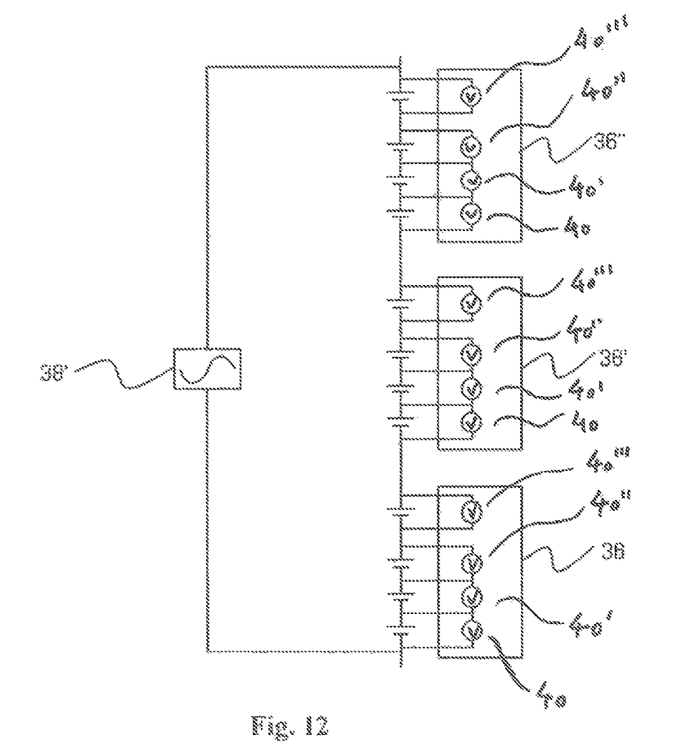

FIG. 12 shows a schematic diagram of a yet further embodiment of a battery management system, where the excitation signal is applied to each individual battery on a pack level 38 so that all connected battery cells are excited by the same excitation signal 38'. The excitation signal is connected to the cells by means of four-terminal sensing for the pack configuration, where the pack comprises a plurality of modules 36, 36', and 36". To get the response signal, the battery voltage measurements wires 40 40' 40" 40''' are used for each module.

LIST OF REFERENCE NUMBERS

In the following is given a list of reference numbers that are used in the detailed description of the invention.

2 step of generating excitation signals,
4 step of applying excitation signals to a battery,
6 step of applying excitation signals to auxiliary components
8 measurement of response signals,
10 curve fitting of electrical equivalent circuit to impedance data,
12 observation of safety operating limits of battery,
14 estimation of operation for auxiliary control components,
16 modelling of battery based on parameter development,
18 estimation of battery aging state and overall health,
20 estimation of energy loss based on battery impedance,
22 determining battery model,
23 extraction of characteristic parameters directly from impedance data,
24 impedance sensor,
26 battery management system,
28 battery,
30 auxiliary control units,
32 interface,
34 battery cell,
36 measurement module,
38 excitation signal, and
40 voltage measurement.

The invention claimed is:

1. A method of determining a State of Health (SoH) and/or State of Charge (SoC) of a rechargeable battery during charging and discharging of said battery, the method comprising the steps of:
   (a) generating a first excitation signal that is a continuously varying harmonic signal having a first frequency within a first selected frequency range;
   (b) generating a second excitation signal that is a single frequency constant signal having a second frequency within a second selected frequency range that comprises frequencies that are higher than the frequencies in the first selected frequency range;
   (c) applying said first and second excitation signals to said rechargeable battery;
   (d) measuring a first response signal for said first excitation signal and a second response signal for said second excitation signal;
   (e) calculating an Electrochemical Impedance (EI) from the ratio between the first and second excitation signals and their respective first and second response signals; and
   (f) determining at least one of the SoH and the SoC of the rechargeable battery by performing at least one of (i) a comparison of the calculated EI to a circuit model for the battery, and (ii) a direct evaluation of characteristics of the EL.

2. The method according to claim 1, wherein the EI includes real and imaginary parts, the method further comprising the step of:
   (g) calculating the real and imaginary parts of the EI; wherein the step of determining at least one of the SoH and the SoC of the rechargeable battery includes curve fitting of the circuit model for the battery to the calculated real and imaginary parts of the EL.

3. The method of claim 2, wherein the step (g) of calculating the real and imaginary parts of the EI includes the sub step of representing the EI in a Nyquist plot, and wherein the step of determining at least one of the SoH and the SoC of the rechargeable battery includes curve fitting of the circuit model for the battery to the Nyquist plot.

4. The method according to claim 1, further comprising the step of: (g) calculating a magnitude of the EI as a function of frequency; wherein the step of determining at least one of the SoH and the SoC of the rechargeable battery includes fitting a magnitude curve (Bode plot) of the EI as a function of frequency to the circuit model of the battery.

5. The method according to claim 1, further comprising the step of: (g) calculating a phase of the EI as a function of frequency; wherein the step of determining at least one of the SoH and/or and the SoC of the rechargeable battery includes fitting a phase curve of the EI as a function of frequency to the circuit model of the battery (Bode plot).

6. The method according to claim 1, wherein the first excitation signal is a current signal and the second excitation signal is a current signal, and wherein the first and second response signals are voltage signals.

7. The method according to claim 1, wherein the EI is determined for each cell or each block of cells in the rechargeable battery, and wherein the cells or blocks of cells are balanced in dependence on the obtained EI for each cell or block of cells.

8. The method according to claim 7, wherein the cells or block of cells are balanced by moving energy from cells or blocks of cells having relatively lower EI to cells or blocks of cells having relatively higher EI.

9. The method according to claim 7, further comprising the steps of:
   determining a capacity of each cell or each block of cells in the rechargeable battery; and
   balancing said cells or blocks of cells by moving energy from cells or blocks of cells having relatively lower capacity and relatively lower EI to cells or blocks of cells having relatively higher capacity and relatively higher EL.

10. The method according to claim 1, wherein said rechargeable battery comprises a plurality of cells, said first and second response signals being measured over each of said cells and said first and second excitation signals being applied over all of said plurality of cells of said rechargeable battery.

11. The method according to claim 1, wherein the method is performed by a modular battery management system for controlling and monitoring a plurality of battery cells interconnected by a power bus, the modular battery management system comprising networked management units operatively connected to an interface unit via a common system data-bus, wherein each of the networked management units comprises an impedance sensor operatively connectable to one of the plurality battery cell for determining the EI of the battery cell.

12. The method according to claim 11, wherein the modular battery management system balances the plurality of battery cells in dependence on the determined EI for each battery cell.

13. The method according to claim 12, wherein the balancing of the plurality of battery cells is performed by moving energy from cells or blocks of cells having relatively lower EI to cells or blocks of cells having relatively higher EI.

14. The method according to claim 1, further comprising measuring the first and second excitation signals, wherein battery voltages and currents are measured simultaneously at a sampling rate of 0.01 ms (10 samples for a maximum of 10 KHz), and wherein all battery voltages are recorded simultaneously.

15. The method according to claim 14, wherein knowledge of an excitation signal waveform is used in combination with measured response signal values to simplify synchronization requirements and to minimize the sampling rate for the battery current measurement.

16. The method according to claim 1, wherein the method is implementable by a microcontroller programmed to execute instructions for performing at least steps (d), (e), and (f).

* * * * *